(12) United States Patent
Kanda et al.

(10) Patent No.: US 6,252,701 B1
(45) Date of Patent: Jun. 26, 2001

(54) OPTICAL FIBER AMPLIFIER

(75) Inventors: Masahiro Kanda; Masahiko Namiwaka, both of Tokyo (JP)

(73) Assignee: NEC Corporation, Tokyo (JP)

( * ) Notice: Subject to any disclaimer, the term of this patent is extended or adjusted under 35 U.S.C. 154(b) by 0 days.

(21) Appl. No.: 09/326,707

(22) Filed: Jun. 7, 1999

(30) Foreign Application Priority Data

Jun. 8, 1998 (JP) .................................................. 10-159105

(51) Int. Cl.[7] ........................................................ H01S 3/00
(52) U.S. Cl. ............................................. 359/341; 359/345
(58) Field of Search ...................................... 359/345, 341

(56) References Cited

U.S. PATENT DOCUMENTS 5,659,644 * 8/1997 DiGiovanni et al. ................... 385/31
5,892,781 * 4/1999 Pan et al. ................................ 372/6
6,058,128 * 5/2000 Ventrudo ............................... 372/96
6,130,899 * 10/2000 Epworth et al. ........................ 372/6

FOREIGN PATENT DOCUMENTS 9-160085  6/1997  (JP) .
9-222621  8/1997  (JP) .

* cited by examiner

*Primary Examiner*—Mark Hellner
(74) *Attorney, Agent, or Firm*—Young & Thompson

(57) ABSTRACT

An optical fiber amplifier includes a signal light source integral with an exciting light source. The optical fiber amplifier has a Fabry-Perot semiconductor laser element having a light emitting element with a wide spectrum. A fiber grating reflects only light having the same wave length as the signal light. The signal light is amplified by an optical fiber, on the broad wave length side of the Fabry-Perot type semiconductor laser element. An inline isolator has a high isolation in the same wave length range as that of the signal light.

14 Claims, 1 Drawing Sheet

OPTICAL FIBER AMPLIFIER

TECHNICAL FIELD

The present invention relates to an optical fiber amplifier having a signal light source and exciting light source which are integral with each other.

BACKGROUND OF THE INVENTION

A prior art optical fiber amplifier has a signal light source for generating a signal light and an exciting light source for generating an exciting light which are separately provided.

FIG. 3 is a block diagram showing an exemplary configuration of a prior art optical fiber amplifier. The prior art optical fiber amplifier comprises an inline isolator 3, a rare earth-doped optical fiber 4, an external modulator 5, a wave length combining coupler (multiplexer) 7, a signal light source 8 and an exciting light source 9.

In FIG. 3, the signal light source for generating the signal light is separated from the exciting light source for generating the exciting light and they are disposed in different positions. The signal light which is generated from the signal light source 8 is combined with the exciting light generated from the exciting light source 9 by the wave length combining coupler 7 and the combined signal light is passed through the inline isolator 3 and the rare earth-doped optical fiber 4 and is incident upon the external modulator 5.

The prior art optical fiber amplifying device disclosed in Japanese Patent Kokai Publication JP-A-9-160085 which is shown as an exemplary prior art comprises two discrete optical fiber amplifiers so that an optical fiber amplifying device of a two stage type or an independent bidirectional transmitting type is formed. In this prior art optical fiber amplifier, reduction in current flowing through the exciting light source, enhancement in gain and increase in output are achieved by increasing the exciting efficiency.

A prior art optical fiber amplifying device disclosed in Japanese Patent Kokai Publication JP-A-9-222621 which is shown as an exemplary prior art comprises a composite optical component having a capability of receiving the power of input signal light which is provided on the input side of the optical fiber amplifier. This optical fiber amplifying device is configured so that it has an exciting mechanism for transmitting the exciting light in a direction opposite to that of the signal light.

However, the following problems have been encountered in the course of investigations toward the present invention. Namely, since the signal light source is separated from the exciting light source in both the above-mentioned prior arts, a high cost is a problem, and the size entire optical fiber amplifier becomes larger since accommodating space in which the light sources are separately disposed is required.

It is therefore an object of the present invention to provide a novel optical fiber amplifier free of the aforementioned drawbacks. Particularly, it is a further object of the present invention to provide an optical fiber amplifier comprising signal light source and exciting light source which are integral with each other.

Other objects of the present invention will become apparent in the entire disclosure.

According to a first aspect of the present invention, there is provided an optical fiber amplifier having a signal light source transmitting a signal light and an exciting light source exciting the signal light, characterized in that the optical fiber amplifier comprises:

a light emitting element having a wide spectrum range, a fiber grating having a diffraction grating adapted to reflect only signal light having a wave length which is on the longer wave length side than that (i.e. a center wave length) of the light emitting element, and the former wave length is in a range that can be amplified by the optical fiber amplifier, an inline isolator having a high isolation ability in the same wave length range as that of said signal light, and an optical fiber adapted to stimulatedly amplify the signal light.

The signal light source and the exciting light source are formed of the same light emitting element.

According to a second aspect of the present invention, in the optical fiber amplifier, the light emitting element is a Fabry-Perot semiconductor laser element.

According to a third aspect of the present invention, the optical fiber amplifier is characterized in that the Fabry-Perot semiconductor laser element has an oscillating wave length characteristic in the 1.48 $\mu$m band and that the oscillated light has a wide spectrum of the 1.48 $\mu$m band.

According to a fourth aspect of the present invention, the optical fiber amplifier is characterized in that the optical fiber is a rare earth doped optical fiber.

According to a fifth aspect of the present invention, the optical fiber amplifier is characterized in that the rare earth doped optical fiber is an optical fiber which is formed by adding any of rare earth elements into a host glass of quartz glass or fluoride glass.

According to a sixth aspect of the present invention, the optical fiber is characterized in that the optical fiber amplifier comprises a 1.55 $\mu$m band signal light source module transmitting the signal light, and a 1.48 $\mu$m band exciting light source exciting the rare earth doped optical fiber. The signal light source module and the exciting light source are formed as an integral module.

According to a seventh aspect of the present invention, the optical fiber amplifier is characterized in that the optical fiber amplifier further comprises an external modulator for modulating the signal light.

According to an eighth aspect of the present invention, the optical fiber amplifier is characterized in that the external modulator is disposed at a rear stage of the optical fiber, the external modulates modulating the signal light which has been amplified by the optical fiber.

According to a ninth aspect of the present invention, the optical fiber amplifier is characterized in that the external modulator is disposed between the fiber grating and the inline isolator. The optical fiber amplifier further includes a wave length-division demultiplexer and a wave length-division multiplexer which are disposed at upstream and downstream of said external modulator, respectively. The demultiplexer is optically connected with the multiplexer via a bypass circuit so that the separated lights which have been separated by the demultiplexer are combined with one another in the multiplexer via the bypass circuit.

PREFERRED EMBODIMENTS

Figure 1:
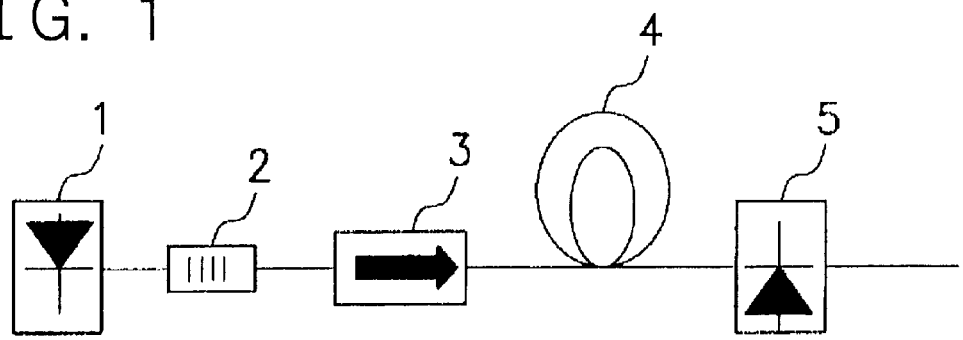
FIG. 1 is a circuit block diagram showing the configuration of the first embodiment of the optical fiber amplifier of the present invention.
Figure 2:
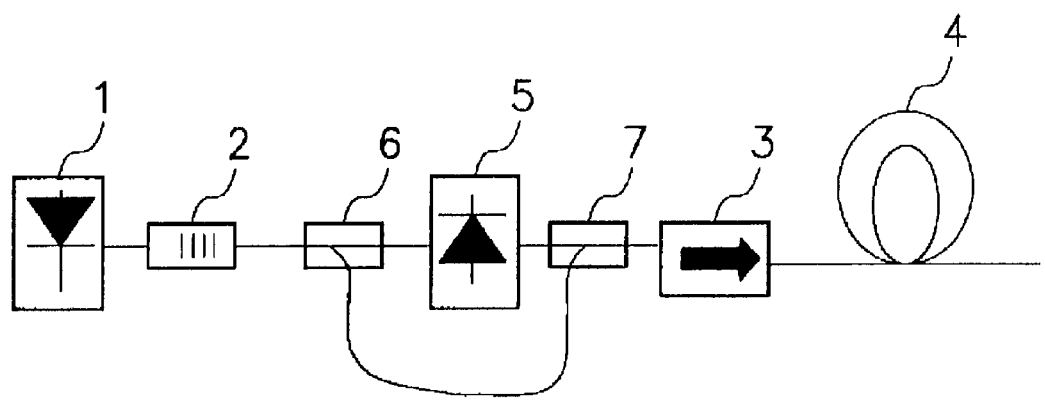
FIG. 2 is a circuit block diagram showing the configuration of a second embodiment of the optical fiber amplifier of the present invention.
Figure 3:
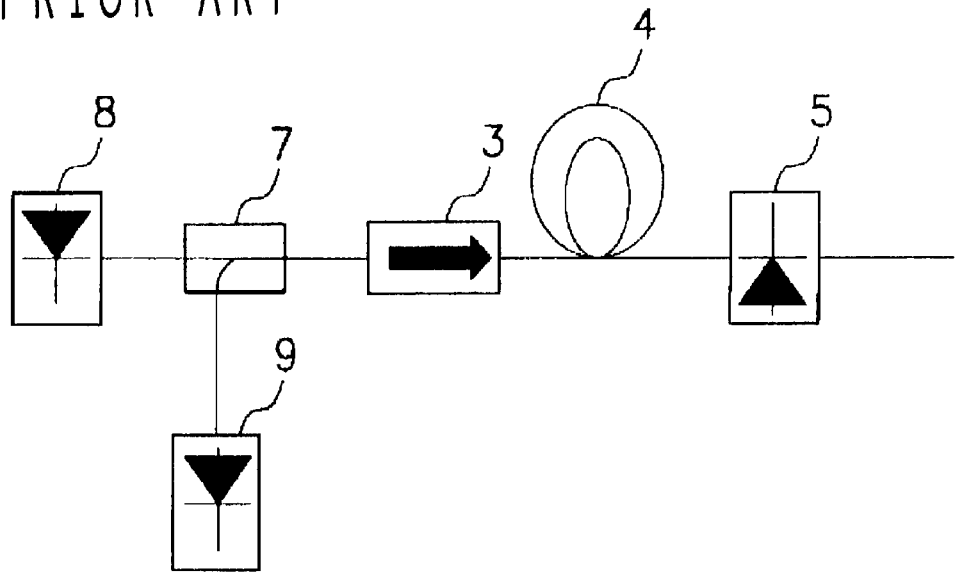
FIG. 3 is a block diagram showing an exemplary prior art circuit configuration.

Now, modes of embodying an optical fiber amplifier of the present invention will be described in detail with reference to annexed drawings. Referring now to FIGS. 1 and 2, an embodiment of the optical fiber amplifier of the present invention is shown. FIGS. 1 and 2 show the optical fiber amplifiers of first and second embodiments of the present invention, respectively.

In FIG. 1, the optical fiber amplifier which is the first embodiment of the present invention comprises a Fabry-Perot type semiconductor laser element 1, fiber grating 2, inline isolator 3, rare earth doped optical fiber 4 and an external modulator 5 in this order. The optical fiber amplifier of the present embodiment comprising the above-mentioned components is formed as a module in which a 1.55 μm band signal light source which transmits a signal light is integral with a 1.48 μm band exciting light source which excites the rare earth doped optical fiber.

The Fabry-Perot type semiconductor laser element 1 is capable of the generating light having an oscillation characteristic of 1.48 μm band wave length using a crystal of indium In, garium Ga, arsenic As, phosphorus P and the like. Accordingly, the light excited by this Fabry-Perot type semiconductor laser element 1 has a wide spectrum range of the 1.48 μm band(i.e., having a broad spectrum band with a center (peak) wave length of 1.48 μm).

The fiber grating 2 comprises a diffraction grating for the signal light having a wave length of the 1.55 μm band in a range having a longer wave length than that (i.e., the center wave length) of the Fabry-Perot type semiconductor laser element 1, provided that the former range can be amplified by the optical fiber amplifier. The fiber grating 2 is a narrow band type fiber grating in which a Bragg diffraction grating is formed in a fiber core by utilizing the change in ultraviolet light induction diffraction index. The diffraction grating has a wave length band of the signal light range, having a longer wave length than that (i.e., center peak spectrum) of the Fabry-Perot type semiconductor 1, provided that the former wave length band can be amplified by the optical fiber amplifier. The diffraction grating has a reflectivity of 0.1 to 50%, particularly 2 to 10%. The half value width of the fiber grating 2 is preset to a desired value in such a manner that the Fabry-Perot type semiconductor laser element 1 is desired to be oscillated in a narrow band.

The inline isolator 3 is an inline isolator using Faraday rotator and the like and has a high isolation ability in the same wave length range as that of the signal light.

The rare earth doped optical fiber 4 is formed by addition of quartz glass or fluoride glass with rare earth elements such as erbium Er and/or neodium Nd so that the ions of the rare earth elements added to the glasses are activated by the exciting light in the 1.48 μm band to provide an inverted population. This causes the signal light in the 1.55 μm band to be subjected to stimulated amplification.

The external modulator 5 may include EA (electro-absorption) modulator, LN modulator etc. using effects such as electro-optical effect or AO (acousto-optic) modulator using effects such as acoustic optical effect.

In the optical fiber amplifier comprising the above-mentioned components in such a manner, an "external" resonator is established by and between the Fabry-Perot semiconductor laser element 1 and the fiber grating 2 having a wave length different (apart) from that of the former laser element 1. The resonation of this resonator enables the light to oscillate the light in a narrow band, that is the 1.55 μm band of the signal light wave length range, which band corresponds to the range of the diffraction grating of the fiber grating 2, that is the wave length range extending on the longer wave length side from that of the Fabry-Perot type semiconductor laser element 1, and which band can be amplified by the optical fiber amplifier.

As mentioned above, the wave length of the Fabry-Perot type semiconductor laser element 1 is separated from that of the diffraction grating of the fiber grating 2 by about 20 or 30 nm or more. Accordingly, not the entire of the wave length range of the single Fabry-Perot type semiconductor laser element 1 can be drawn (taken over) into a wave length range of the fiber grating 2. Thus, in this system oscillation may also occur in the wave length range of the single Fabry-Perot type semiconductor laser element 1. Therefore, two wave lengths such as a wave length which is determined by the fiber grating 2 and another wave length of the Fabry-Perot type semiconductor laser element 1 are taken out. In the present embodiment, the lights having two wave lengths are used as signal light and exciting light for the optical fiber amplifier.

Referring now to FIG. 1 again, the optical fiber amplifier of the present embodiment takes the signal light and the exciting light out of the same Fabry-Perot type semiconductor laser element 1. After the amplifier amplifies the removed signal light in the rare earth doped optical fiber 4, the signal light is modulated by the external modulator 5.

Now, operation in the first embodiment of the present invention shown in FIG. 1 will be described with reference to the annexed drawings. The light which is emitted from the Fabry-Perot type semiconductor laser element 1 is collected to an optical fiber having the fiber grating 2 in which the Bragg diffraction grating is formed. Part of the light is reflected on the fiber grating 2 so that an external resonator is formed between the fiber grating 2 and the rear side of the Fabry-Perot type semiconductor laser element 1. The external resonator is capable of oscillating the light having only a desired wave length which is determined by the diffraction grating of the fiber grating 2 in the wave length range of the Fabry-Perot type semiconductor laser element 1 which has a wide oscillation wave length width of 50 nm (40 dB down width) or more. That is, the external resonator is capable of oscillating light in a narrow band having a half value width of 1 nm or less within the wide wave length range of the Fabry-Perot type semiconductor laser element.

As mentioned above, the wave length of the Fabry-Perot type semiconductor laser element 1 is separated from that of the diffraction grating of the fiber grating 2 by several tens of nanometers. Accordingly, not all the wave lengths of the single Fabry-Perot type semiconductor laser element 1 can be absorbed into the wave length range determined by the fiber grating 2. As a result, two wave lengths, i.e. a wave length which is determined by the fiber grating 2 and another wave length of the Fabry-Perot type semiconductor laser element 1 can removed.

The light beams having two wave lengths pass through the inline isolator 3 and is incident upon the rare earth doped optical fiber 4. The signal light in the 1.55 μm band is amplified by the stimulated emission of the 1.48 μm exciting light in the rare earth doped optical fiber 4. The amplified signal light is modulated to a high frequency by the external modulator 5 and is taken out of the optical fiber end (not shown). ASE (amplified spontaneous emission) which is generated in the rare earth doped optical fiber 4 is prevented from entering the Fabry-Perot type semiconductor laser element 1 by the inline isolator 3.

A first effect of the first embodiment of the present invention resides in that the optical fiber amplifier can be made compact. The reason is that the signal light source is integral (unison) with the exciting light source in contrast to the prior art in which they had to be separate.

A second effect of the first embodiment of the present invention resides in that an economical optical fiber amplifier can be provided. The reason is that the signal light source is integral with the exciting light source and the necessity of the wave length combining coupler (multiplexer) for combining the signal light with the exciting light can be omitted, in contrast to the prior art in which the multiplexer is essential.

A third effect of the first embodiment of the present invention resides in that the NF (noise factor) of the optical fiber amplifier can be lowered. The reason is that since no wave length combining coupler (wave length-division multiplexer) is required, the loss at the wave length combining coupler is eliminated so that the loss at an input stage upstream of the rare earth doped optical fiber can be reduced.

Now, a second embodiment of the present invention will be described with reference to the annexed drawings. In FIG. 2, the optical fiber amplifier of the second embodiment of the present invention comprises a Fabry-Perot type semiconductor laser element 1, fiber grating 2, wave length-division coupler (demultiplexer) 6, external modulator 5, wave length combining coupler (wave length-division multiplexer) 7, inline isolator 3 and rare earth doped optical fiber 4, are connected in series. The wave length-division demultiplexer 6 is coupled to the wave length combining coupler 7 so that the lights, the wave lengths of which are separated by the wave length-division demultiplexer 6, are combined with each other in the wave length combining coupler 7.

In the second embodiment of the present invention, the light which exits from the fiber grating 2 is separated into the signal light and the exciting light by the wave length-division demultiplexer 6 and only the signal light is modulated by the external modulator 5. After the modulation, the signal light is combined (multiplexed) with the exciting light by the wave length combining coupler 7 and the signal light is amplified by the rare earth doped optical fiber 4.

Although preferred embodiments of the present invention have been described, the invention is not limited thereto. A number of various modifications can be made without departing from the spirit of the invention.

The meritorious effect of the present invention are summarized as follows.

As is apparent from the foregoing description, in the optical fiber amplifier of the present invention, light in the wave length band of the signal light range, has longer wave length than that (center spectrum) of the light emitting element, which has a wide spectrum range, and which can be amplified by the optical fiber amplifier is oscillated by the fiber grating. Since the wave length of the light emitting element is separate from that of the fiber grating by several tens nanometers, not all the wave lengths of the light from the light emitting element can be absorbed into the diffraction wave length range of the fiber grating and thus oscillation may also occur in the wave length range of the light emitting element. Therefore, the signal light from the light emitting element having the same signal light and exciting light source can be stimulatedly amplified.

It should be noted that other objects of the present invention will become apparent in the entire disclosure and that modifications may be done without departing from the spirit and scope of the present invention as disclosed herein and appended herewith.

Also it should be noted that any combination of the disclosed and/or claimed elements, matters and/or items may fall under the modifications aforementioned.

What is claimed is:

1. An optical fiber amplifier having a signal light source transmitting a signal light and an exciting light source exciting said signal light, wherein said optical fiber amplifier comprises:
   (a) a light emitting element having a wide spectrum range,
   (b) a fiber grating having a diffraction grating adapted to reflect only signal light having a wave length which is on the longer wave length side than a center wave length of said light emitting element, and which wave length is in a range that can be amplified by said optical fiber amplifier,
   (c) an inline isolator having a high isolation ability in the same wave length range as that of said signal light, and
   (d) an optical fiber adapted to stimulatedly amplify said signal light,
   (e) said signal light source and said exciting light source being formed of the same light emitting element.

2. The optical fiber amplifier as defined in claim 1, wherein said light emitting element is a Fabry-Perot semiconductor laser element.

3. The optical fiber amplifier as defined in claim 2, wherein said Fabry-Perot semiconductor laser element has an oscillating wave length characteristic of a1.48 $\mu$m band, and
   wherein its oscillated light has a wide spectrum of said 1.48 $\mu$m band.

4. The optical fiber amplifier as defined in claim 1, wherein said optical fiber is a rare earth doped optical fiber.

5. The optical fiber amplifier as defined in claim 4, wherein said rare earth doped optical fiber is an optical fiber which is formed by adding any of rare earth elements into a host glass of quartz glass or fluoride glass.

6. The optical fiber amplifier as defined in claim 1, wherein said optical fiber amplifier comprises a 1.55 $\mu$m band signal light source module transmitting said signal light, and a 1.48 $\mu$m band exciting light source exciting said rare earth doped optical fiber, said signal light source module and said exciting light source being formed as an integral module.

7. The optical fiber amplifier as defined in claim 1, wherein said optical fiber amplifier further comprises an external modulator modulating said signal light.

8. The optical fiber amplifier as defined in claim 7, wherein said external modulator is disposed at a rear stage of said optical fiber, said external modulator modulating said signal light which has been amplified by said optical fiber.

9. The optical fiber amplifier as defined in claim 1, wherein said fiber grating has a diffraction grating of a substantially narrow wave length as compared to said wide spectrum range of the light emitting element.

10. The optical fiber amplifier as defined in claim 1, wherein said light emitting element, said fiber grating, said inline isolator, and said optical fiber are optically coupled in that order.

11. The optical fiber amplifier as defined in claim 8, wherein said light emitting element, said fiber granting, said inline isolator, and said optical fiber are optically coupled in this order.

12. The optical fiber amplifier as defined in claim 7, wherein said external modulator is disposed between said fiber grating and said inline isolator, wherein said optical fiber amplifier further includes a wave length-division demultiplexer and a wave length-division multiplexer which are disposed upstream and downstream of said external modulator, respectively, and wherein said demultiplexer is optically connected with said multiplexer through a bypass circuit so that the separated lights which have been separated by said demultiplexer are combined with one another in said multiplexer via said bypass circuit.

13. The optical fiber amplifier as defined in claim 12, wherein said light emitting element, said fiber grating and said demultiplexer are optically coupled in that order, and wherein said multiplexer, said inline isolator and said optical fiber are optically coupled in that order.

14. The optical fiber amplifier as defined in claim 1, wherein said fiber grating has a diffraction grating adapted to reflect only signal light having a band width of 1 nm or less in terms of half width value.

\* \* \* \* \*